(12) United States Patent
Chen et al.

(10) Patent No.: US 11,930,663 B2
(45) Date of Patent: Mar. 12, 2024

(54) DISPLAY PANEL

(71) Applicant: Au Optronics Corporation, Hsinchu (TW)

(72) Inventors: Bo-Chen Chen, Hsinchu (TW);
Yun-Ru Cheng, Hsinchu (TW);
Ya-Ling Hsu, Hsinchu (TW);
Chia-Hsuan Pai, Hsinchu (TW);
Cheng-Wei Huang, Hsinchu (TW);
Wei-Shan Chao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 281 days.

(21) Appl. No.: 17/226,100

(22) Filed: Apr. 9, 2021

(65) Prior Publication Data
US 2022/0013592 A1    Jan. 13, 2022

Related U.S. Application Data

(60) Provisional application No. 63/049,250, filed on Jul. 8, 2020.

(30) Foreign Application Priority Data

Dec. 18, 2020   (TW) ................. 109144824

(51) Int. Cl.
*H10K 59/121* (2023.01)
*H10K 50/842* (2023.01)
*H10K 59/131* (2023.01)

(52) U.S. Cl.
CPC ....... *H10K 59/121* (2023.02); *H10K 50/8426* (2023.02); *H10K 59/131* (2023.02)

(58) Field of Classification Search
CPC .................. G02F 1/1339; H10K 50/8426; H10K 59/131; H10K 59/121
See application file for complete search history.

(56) References Cited

U.S. PATENT DOCUMENTS 8,223,309 B2   7/2012 Shiau
9,236,424 B2   1/2016 Kesho et al.
(Continued)

FOREIGN PATENT DOCUMENTS

CN   1782795   6/2006
CN   1794071   6/2006
(Continued)

*Primary Examiner* — Vongsavanh Sengdara
(74) *Attorney, Agent, or Firm* — JCIPRNET

(57) ABSTRACT

A display panel includes a first substrate, pixel structures, a first common pad, a second substrate, a second common electrode, a display medium and a conductive particle. The pixel structures are disposed on an active area of the first substrate. The first common pad is disposed on a peripheral area of the first substrate, and is electrically connected to first common electrodes of the pixel structures. The second common electrode is disposed on the second substrate. The conductive particle is disposed on the first common pad, and is electrically connected to the first common pad and the second common electrode. The conductive particle includes a core and a conductive film disposed on a surface of the core, where the conductive film has a main portion and raised portions, and a film thickness of each of the raised portions is greater than a film thickness of the main portion.

11 Claims, 8 Drawing Sheets

(56) References Cited

U.S. PATENT DOCUMENTS

| | | | |
|---|---|---|---|
| 2006/0132697 A1* | 6/2006 | Ueshima | G02F 1/1339 |
| | | | 349/155 |
| 2011/0079799 A1* | 4/2011 | Lee | C09J 7/20 |
| | | | 428/323 |
| 2011/0085118 A1 | 4/2011 | Shiau | |
| 2011/0155430 A1* | 6/2011 | Lee | C09J 9/02 |
| | | | 252/514 |
| 2014/0319528 A1* | 10/2014 | Kesho | H10K 59/131 |
| | | | 257/59 |
| 2017/0271299 A1* | 9/2017 | Li | H01L 24/83 |
| 2017/0352716 A1* | 12/2017 | Lee | H01L 24/32 |
| 2021/0320146 A1* | 10/2021 | Kim | H01L 33/005 |
| 2021/0333587 A1 | 10/2021 | Zhang | |
| 2022/0223315 A1* | 7/2022 | Tanaka | H01B 1/22 |
| 2023/0095418 A1* | 3/2023 | Park | G09G 3/32 |
| | | | 345/214 |

FOREIGN PATENT DOCUMENTS

| | | |
|---|---|---|
| CN | 101487962 | 7/2009 |
| CN | 102591060 | 7/2012 |
| CN | 104122687 | 10/2014 |
| CN | 104808398 | 7/2015 |
| CN | 107300793 | 10/2017 |
| CN | 110579912 | 12/2019 |
| TW | 201113608 | 4/2011 |
| TW | 201740391 | 11/2017 |

\* cited by examiner

DISPLAY PANEL

CROSS-REFERENCE TO RELATED APPLICATION

This application claims the priority benefit of U.S. provisional application Ser. No. 63/049,250, filed on Jul. 8, 2020, and Taiwan application serial no. 109144824, filed on Dec. 18, 2020. The entirety of each of the above-mentioned patent applications is hereby incorporated by reference herein and made a part of this specification.

BACKGROUND OF THE DISCLOSURE

Technical Field

The disclosure relates to an optoelectronic device, and especially relates to a display panel.

Description of Related Art

With the development of display technology, people's demand for display panels is no longer satisfied with optical characteristics such as high resolution, high contrast, and wide viewing angles. People also expect display panels to have an elegant appearance. For example, people expect the display panel to have a narrow frame or even no frame.

In generally, a display panel includes a pixel array substrate, an opposite substrate, a display medium displayed between the two, multiple conductive particles, where the pixel array substrate has a common pad disposed in a peripheral area, the opposite substrate has a common electrode, the multiple conductive particles are disposed between the pixel array substrate and the opposite substrate, and the common pad of the pixel array substrate and the common electrode of the opposite substrate are electrically connected to each other through the multiple conductive particles. However, when the frame of the display panel is to be narrowed, the disposition of the common pad creases the limitation of narrowing the border. Moreover, the conductive particles are also less likely to be well electrically connected to the common pad of the pixel array substrate and the common electrode of the opposite substrate easily.

SUMMARY

In an embodiment of the disclosure, a display panel having good performance is provided.

A display panel according to an embodiment of the disclosure includes a first substrate, multiple pixel structures, a first common pad, a second substrate, a second common electrode, a display medium, and at least one conductive particle. A first substrate includes an active area and a peripheral area outside the active area. Multiple pixel structures are disposed on the active area of the first substrate, where each of the multiple pixel structures includes an active component, a pixel electrode electrically connected to the active component, and a first common electrode. A first common pad is disposed on the peripheral area of the first substrate, and electrically connected to multiple first common electrodes of the multiple pixel structures. A second substrate is disposed opposite to the first substrate. A second common electrode is disposed on the second substrate. A display medium is disposed between the first substrate and the second substrate. At least one conductive particle is disposed on the first common pad, and electrically connected to the first common pad and the second common electrode. The at least one conductive particle includes a core, and a conductive film, disposed on a surface of the core, where the conductive film includes a main portion and multiple raised portions, and a film thickness of each of the multiple raised portions is greater than a film thickness of the main portion.

A display panel according to an embodiment of the disclosure includes a first substrate, multiple pixel structures, multiple data lines, multiple scan lines, multiple transfer lines, a first common pad, a second substrate, a second common electrode, a display medium, at least one conductive particle, and a first insulating layer. A first substrate includes an active area and a peripheral area outside the active area. Multiple pixel structures are disposed on the active area of the first substrate, where each of the multiple pixel structures includes an active component, a pixel electrode electrically connected to the active component, and a first common electrode. Multiple data lines are disposed on the first substrate, and electrically connected to multiple active components of the multiple pixel structures, where the multiple data lines are arranged in a first direction. Multiple scan lines are disposed on the first substrate, and electrically connected to the multiple active components of the multiple pixel structures, where the multiple scan lines are arranged in a second direction, and the first direction and the second direction are staggered. Multiple transfer lines are disposed on the first substrate, where the multiple transfer lines are electrically connected to the multiple scan lines, and are arranged in the first direction. A first common pad is disposed on the peripheral area of the first substrate, and electrically connected to multiple first common electrodes of the multiple pixel structures. A second substrate is disposed opposite to the first substrate. A second common electrode is disposed on the second substrate. A display medium is disposed between the first substrate and the second substrate. At least one conductive particle is disposed on the first common pad, and electrically connected to the first common pad and the second common electrode. A first insulating layer is disposed on the first substrate, where the first common pad includes a first conductive pattern, and at least one portion of the first conductive pattern is disposed in a through hole of the first insulating layer. In a top view of the display panel, the through hole of the first insulating layer has a first width in the first direction, the through hole of the first insulating layer has a second width in the second direction, and the first width is different with the second width.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
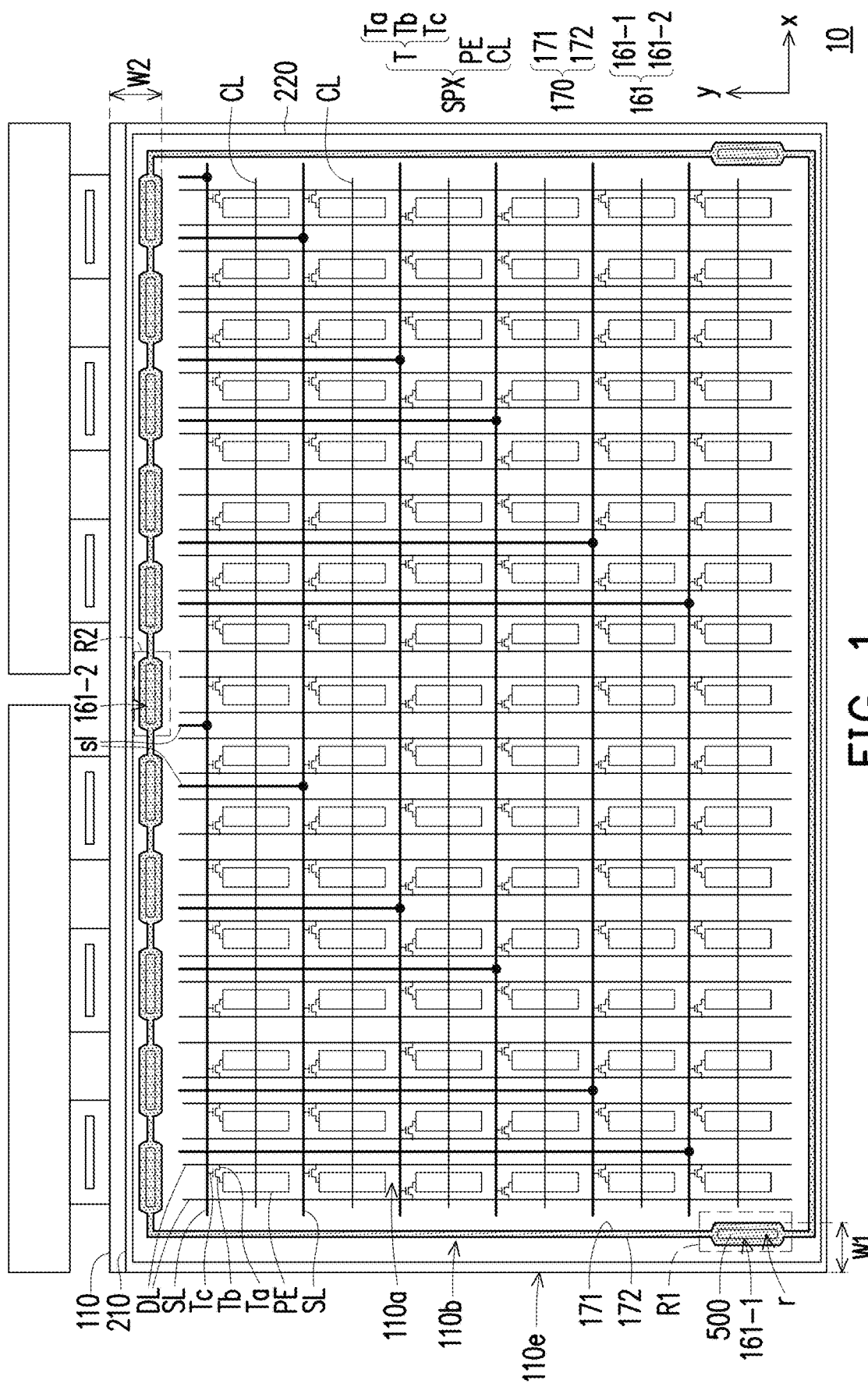
FIG. 1 is a schematic top view of a display panel 10 according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

It should be understood that when a corresponding component such as a film layer or area is referred to as being "on another component", it may be directly on the other component, or there may be other components between the two. On the other hand, when a component is referred to as being "directly on another component", there is no component between the two. As used herein, "connected" can refer to physical and/or electrical connection. Furthermore, "electrically connected" or "coupled" may mean that there are other elements between two components.

As used herein, "about", "approximately", or "substantially" includes the stated value and the average value within the acceptable deviation range of the specific value determined by a person of ordinary skill in the art, taking into account the measurement and the specific amount of measurement-related error (i.e. the limitation of the measurement system). For example, "about" can mean within one or more standard deviations of the stated value, or within ±30%, ±20%, ±10%, ±5%. Furthermore, the "about", "approximately" or "substantially" used herein can select a more acceptable range of deviation or standard deviation based on optical properties, etching properties, or other properties, instead of using one standard deviation for all properties.

Unless otherwise defined, all terms (including technical and scientific terms) used herein have the same meaning as commonly understood by those of ordinary skill in the art to which the disclosure belongs. It will be further understood that terms such as those defined in commonly used dictionaries should be interpreted as having meanings consistent with their meanings in the context of related technologies and the disclosure, and will not be interpreted as idealized or excessively formal meanings unless explicitly so in this context definition.

FIG. 1 is a schematic top view of a display panel 10 according to an embodiment of the disclosure.

Figure 2:
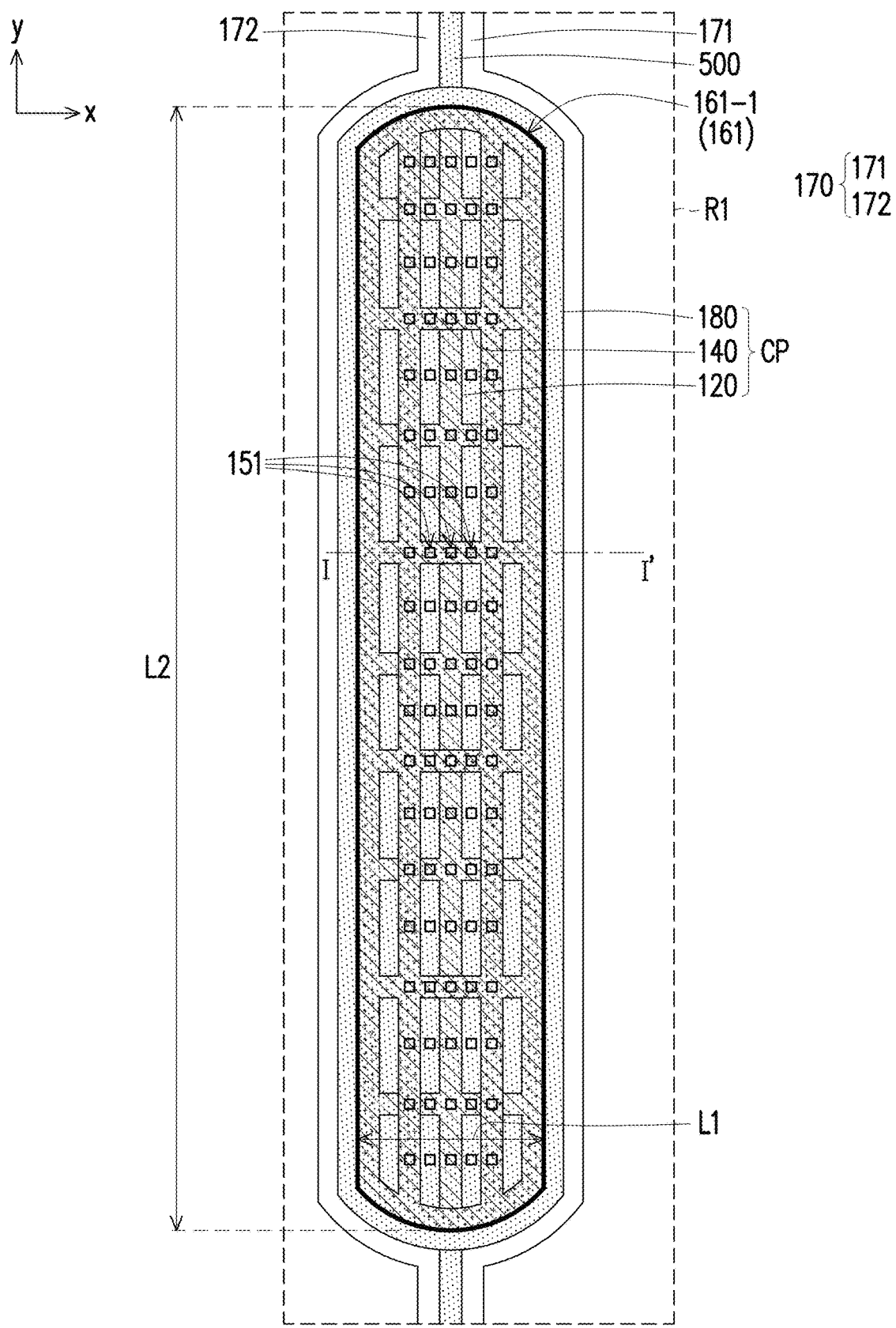
FIG. 2 is a partial enlarged schematic view of a display panel 10 according to an embodiment of the disclosure.

FIG. 2 is a partial enlarged schematic view of a display panel 10 according to an embodiment of the disclosure. FIG. 2 corresponds to a part R1 of FIG. 1.

For the sake of clarity, in FIG. 1, the first common pad CP disposed on the first substrate 110 and multiple contact windows 151 of the second insulating layer 150 are omitted, and the first common pad CP and the multiple contact windows 151 are shown in the enlarged FIG. 2.

Figure 3:
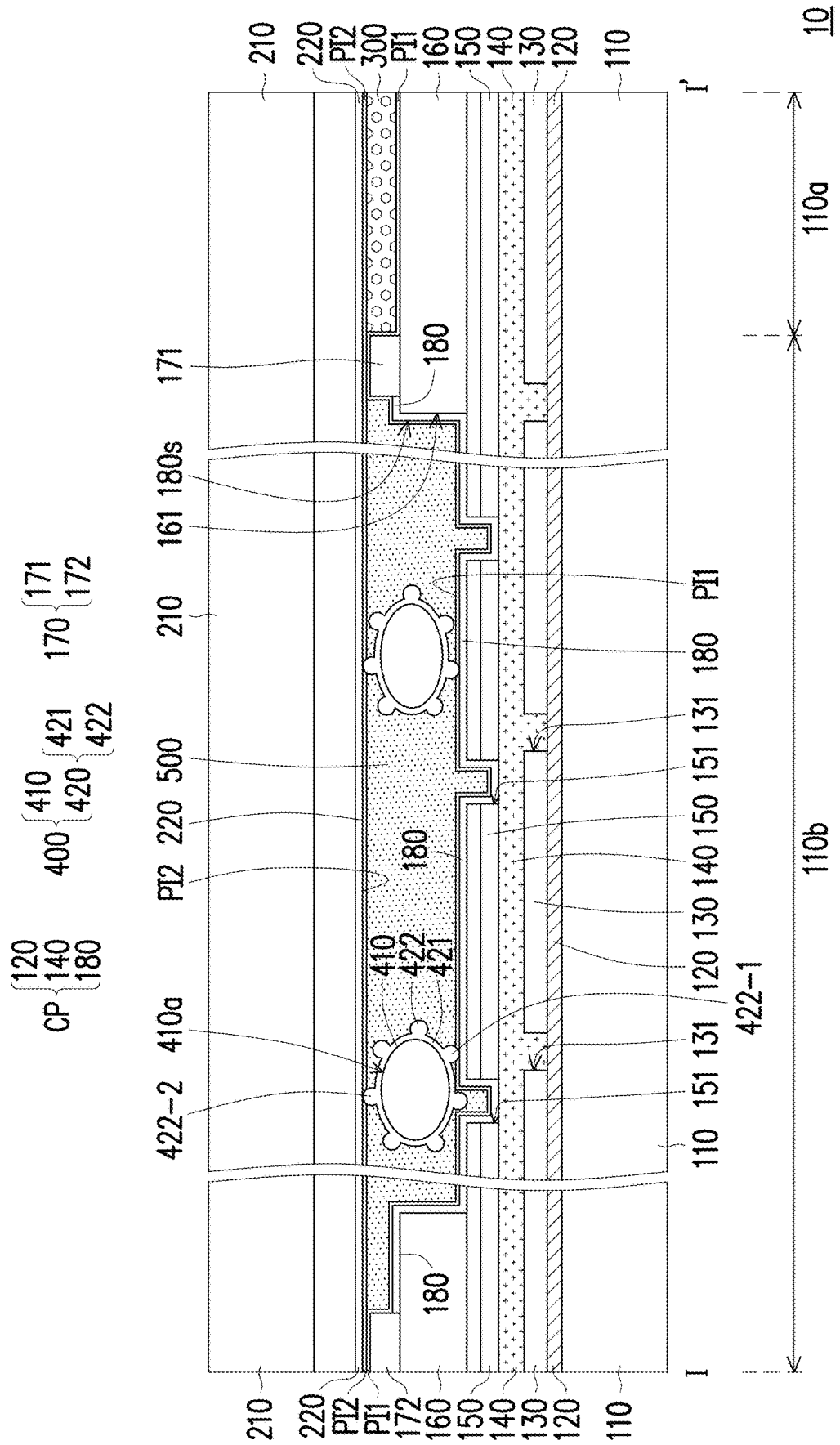
FIG. 3 is a schematic cross-sectional view of a display panel 10 according to an embodiment of the disclosure.

FIG. 3 is a schematic cross-sectional view of a display panel 10 according to an embodiment of the disclosure. FIG. 3 corresponds to a section line I-I' of FIG. 2.

For the sake of clarity, in FIG. 2, a conductive particle 400, a display medium 300, and multiple contact windows 131 of a third insulating layer 130 of FIG. 3 are omitted.

Figure 4:
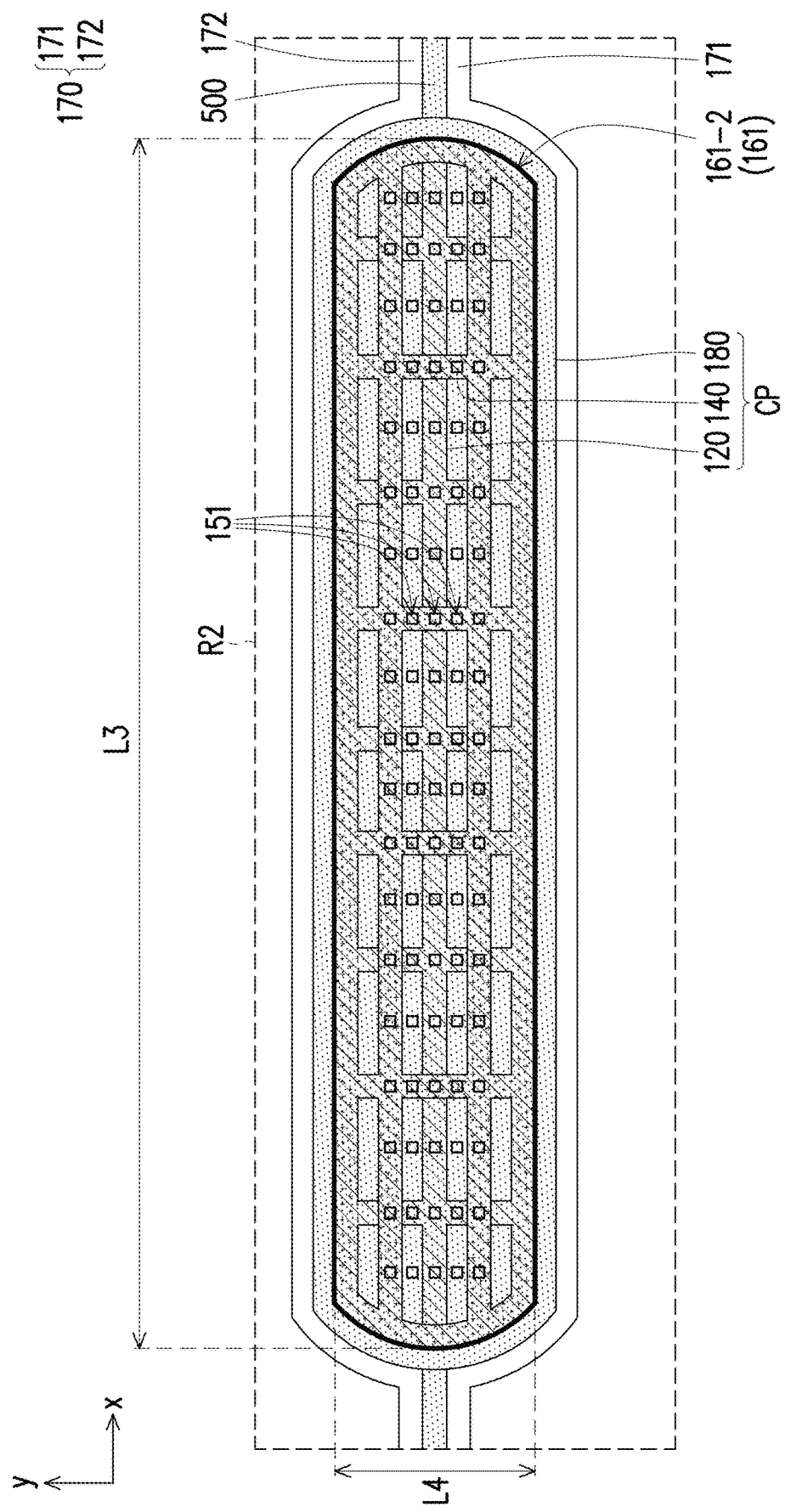
FIG. 4 is a partial enlarged schematic view of a display panel 10 according to an embodiment of the disclosure.

FIG. 4 is a partial enlarged schematic view of a display panel 10 according to an embodiment of the disclosure. FIG. 4 corresponds to a part R2 of FIG. 1.

With reference to FIGS. 1, 2 and 3, the display panel 10 includes the first substrate 110, which includes an active area 110a, and a peripheral area 110b outside the active area 110a. In the present embodiment, the material of the first substrate 110 may be glass, quartz, organic polymer, or opaque/reflection material (for example: wafer, ceramic, or other applicable materials), or other applicable materials.

With reference to FIG. 1, the display panel 10 further includes multiple pixel structures SPX, disposed on the active area 110a of the first substrate 110. Each of the multiple pixel structures SPX includes an active component T, a pixel electrode PE electrically connected to the active component T, and a first common electrode CL. Specifically, in the present embodiment, the active component T may include a thin film transistor which includes a first terminal Ta, a second terminal Tb, and a control terminal Tc; the pixel electrode PE is electrically connected to the second terminal Tb of the thin film transistor; the first common electrode CL partially overlaps the pixel electrode PE so as to form a storage capacitance.

In the present embodiment, the display panel 10 further includes multiple data lines DL and multiple scan lines SL. The multiple data lines DL and the multiple scan lines SL are disposed on the first substrate 110, and are electrically connected to the multiple active components T of the multiple pixel structures SPX. Specifically, in the present embodiment, the first terminal Ta of the thin film transistor of each of the multiple pixel structures SPX is electrically connected to the corresponding data line DL, and the control terminal Tc of the thin film transistor of each the multiple pixel structures SPX is electrically connected to the corresponding scan line SL. The multiple data lines DL are arranged in a first direction x, the multiple scan lines SL are arranged in a second direction y, and the first direction x and the second direction y are staggered. For example, in the present embodiment, the first direction x and the second direction y may be perpendicular to each other, but the disclosure is not limited thereto.

In the present embodiment, in order to make a border width W1 of the display panel 10 smaller, the display panel 10 may selectively include multiple transfer lines sl. The multiple transfer lines sl are disposed on the first substrate 110, electrically connected to the multiple scan lines SL, and arranged in the first direction x. In a top view of the display panel 10, the multiple transfer lines sl are interspersed in an array formed by the multiple pixel structures SPX.

With reference to FIG. 1, FIG. 2, FIG. 3, and FIG. 4, the display panel 10 further includes the at least one first common pad CP, disposed on the peripheral area 110b of the first substrate 110, and is electrically connected to multiple first common electrodes CL of the multiple pixel structures SPX.

With reference to FIG. 2, FIG. 3 and FIG. 4, in the present embodiment, each of the multiple first common pads CP may include a first conductive pattern 180. The display panel 10 further includes a first insulating layer 160 disposed on the first substrate 110 (shown in FIG. 3), where at least one portion of the first conductive pattern 180 may be disposed on the first insulating layer 160, and the first insulating layer 160 is located between the at least one portion of the first conductive pattern 180 and the first substrate 110.

With reference to FIG. 1, FIG. 2, FIG. 3 and FIG. 4, for example, in the present embodiment, the first conductive pattern 180 of the first common pad CP may be selectively formed on a same transparent conductive film as the pixel electrode PE of the pixel structure SPX, but the disclosure is not limited thereto. In the present embodiment, the transparent conductive film may selectively include metal oxide, for example: indium tin oxide, indium zinc oxide, aluminum tin oxide, aluminum zinc oxide, indium germanium zinc oxide, other suitable oxides, or a stack layer of at least two of the above, but the disclosure is not limited thereto.

With reference to FIG. 2, FIG. 3 and FIG. 4, in the present embodiment, each of the multiple first common pads CP may selectively include a second conductive pattern 140. The display panel 10 further includes the second insulating layer 150 disposed on the first substrate 110 (shown in FIG. 3), where the second insulating layer 150 is disposed between the first conductive pattern 180 and the first substrate 110, the second conductive pattern 140 is disposed between the second insulating layer 150 and the first substrate 110, and the first conductive pattern 180 is electrically connected to the second conductive pattern 140 through the at least one contact window 151 of the second insulating layer 150.

In the present embodiment, multiple areas of the first conductive pattern 180 may be electrically connected to multiple areas of the second conductive pattern 140 through multiple contact windows 151 of the second insulating layer 150. In other words, in the present embodiment, the first conductive pattern 180 and the second conductive pattern 140 of the first common pad CP may be selectively connected in parallel, but the disclosure is not limited thereto. Furthermore, with reference to FIG. 1, FIG. 2, FIG. 3, and FIG. 4, in the present embodiment, the second conductive pattern 140 of the first common pad CP may be selectively formed on a same second metal layer as the data line DL, but the disclosure is not limited thereto.

With reference to FIG. 2, FIG. 3, and FIG. 4, in the present embodiment, each of the multiple first common pads CP may further selectively include a third conductive pattern 120. The display panel 10 further includes the third insulating layer 130 disposed on the first substrate 110 (shown in FIG. 3), where the second conductive pattern 140 is disposed between the second insulating layer 150 and the third insulating layer 130, the third conductive pattern 120 is disposed between the third insulating layer 130 and the first substrate 110, the third insulating layer 130 includes the at least one contact window 131 disposed in the peripheral area 110b, and the second conductive pattern 140 is electrically connected to the third conductive pattern 120 through the at least one contact window 131 of the third insulating layer 130.

In the present embodiment, the multiple areas of the second conductive pattern 140 may be electrically connected to multiple areas of the third conductive pattern 120 through the multiple contact windows 131 of the third insulating layer 130. In other words, in the present embodiment, the second conductive pattern 140 and the third conductive pattern 120 of the first common pad CP may be selectively connected in parallel, but the disclosure is not limited thereto. With reference to FIG. 1, FIG. 2, FIG. 3 and FIG. 4, in the present embodiment, the third conductive pattern 120 of the first common pad CP may be selectively formed on a same first metal layer as the scan line SL, but the disclosure is not limited thereto.

With reference to FIG. 2, FIG. 3, and FIG. 4, in the present embodiment, the first common pad CP may selectively include the first conductive pattern 180, the second conductive pattern 140, and the third conductive pattern 120. However, the disclosure is not limited thereto. In other embodiments, the first common pad CP may also include any one or any two of the first conductive pattern 180, the second conductive pattern 140, and the third conductive pattern 120, and the disclosure is not limited thereto.

With reference to FIG. 2 and FIG. 4, in the present embodiment, the first conductive pattern 180 may be selectively in an elongated strip shape (for example, a long capsule shape, but the disclosure is not limited thereto), the second conductive pattern 140 may be selectively in a grid shape, and the third conductive pattern 120 may be selectively in another grid shape corresponding to the second conductive pattern 140. However, the disclosure is not limited thereto. In other embodiments, the shape of the first conductive pattern 180, the shape of the second conductive pattern 140, and/or the shape of the third conductive pattern 120 may be designed according to actual needs.

With reference to FIG. 2, FIG. 3, and FIG. 4, in the present embodiment, the display panel 10 further includes a first alignment film PI1 (shown in FIG. 3), disposed on the first substrate 110 and covering at least a portion of the first common pad CP. Specifically, in the present embodiment, the first alignment film PI1 is disposed on the multiple pixel electrodes PE of the multiple pixel structures SPX, the first insulating layer 160, and the first conductive pattern 180 of the first common pad CP.

With reference to FIG. 1, FIG. 2, FIG. 3, and FIG. 4, the display panel 10 further includes a second substrate 210, disposed opposite to the first substrate 110. For example, in the present embodiment, the material of the second substrate 210 may be glass, quartz, organic polymer, or other applicable materials. The display panel 10 further includes the including display medium 300 (shown in FIG. 3) disposed between the first substrate 110 and the second substrate 210. For example, in the present embodiment, the display medium 300 may be a liquid crystal layer, but the disclosure is not limited thereto. In other embodiments, the display medium 300 may also be multiple organic electroluminescence patterns, multiple micro LED (µLED) components, or other applicable materials.

The display panel 10 further includes a second common electrode 220, disposed on the second substrate 210. The second common electrode 220 is located between the second substrate 210 and the display medium 300. For example, in the present embodiment, the second common electrode 220 may be a transparent conductive film, and its material may be a including metal oxide, for example: indium tin oxide, indium zinc oxide, aluminum tin oxide, aluminum zinc oxide, indium germanium zinc oxide, other suitable oxide, or a stack layer of at least two of the above, but the disclosure is not limited thereto.

In the present embodiment, the display panel 10 further includes a second alignment film PI2 (shown in FIG. 3) disposed on the second substrate 210 and covering the second common electrode 220. The second common electrode 220 is located between the second substrate 210 and the second alignment film PI2.

With reference to FIG. 2, FIG. 3, and FIG. 4, the display panel 10 further includes at least one conductive particle 400, located between the peripheral area 110b of the first substrate 110 and the second substrate 210. The at least one conductive particle 400 is disposed on the first common pad CP, is electrically connected to the first common pad CP on the first substrate 110 and the second common electrode 220 on the second substrate 210.

Figure 5:
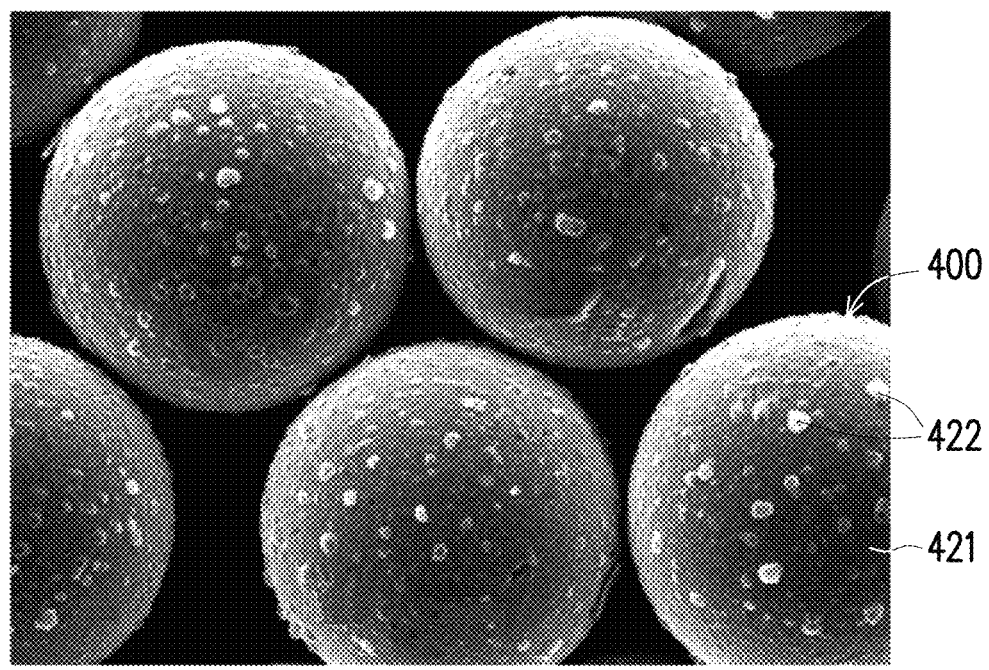
FIG. 5 shows multiple conductive particles 400 according to an embodiment of the disclosure.
Figure 6:
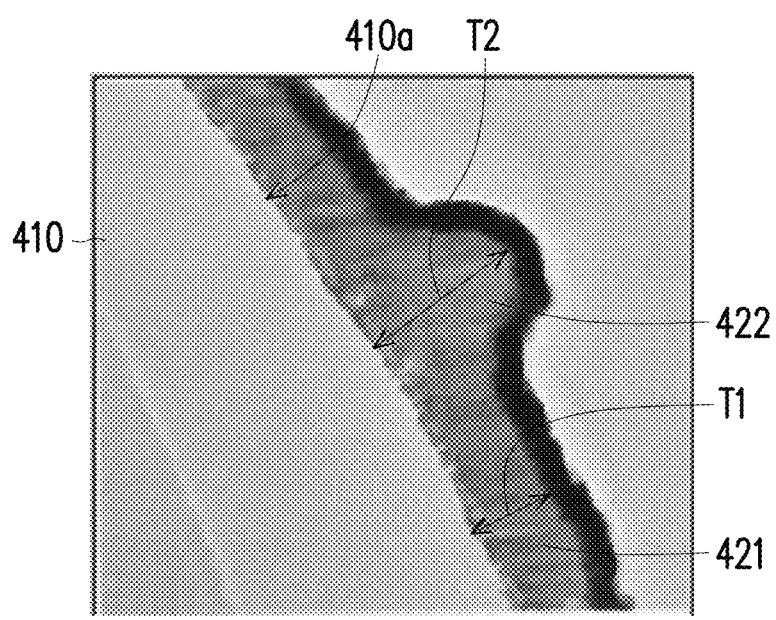
FIG. 6 shows part of a cross-section of a conductive particle 400 according to an embodiment of the disclosure.

FIG. 5 shows multiple conductive particles 400 according to an embodiment of the disclosure. FIG. 6 shows part of a cross-section of a conductive particle 400 according to an embodiment of the disclosure.

With reference to FIG. 3, FIG. 5, and FIG. 6, each of the conductive particles 400 includes a core 410, and a conductive film 420 disposed at a surface 410a of the core 410. In particular, the conductive film 420 includes a main portion 421 and multiple raised portions 422, and a film thickness T2 (shown in FIG. 6) of each of the multiple raised portions 422 is greater than a film thickness T1 (shown in FIG. 6) of the main portion 421.

The main portion 421 of the conductive film 420 and the multiple raised portions 422 dispersed with each other form a rough outer surface of the conductive particles 400. In the present embodiment, the core 410 of the conductive particle 400 may be deformed due to pressure, and the conductive film 420 of the conductive particle 400 has high electrical conductivity. For example, in the present embodiment, the material of the core 410 of the conductive particle 400 is nickel, and the material of the conductive film 420 of the conductive particle 400 is gold, but the disclosure is not limited thereto.

It is worth noting that the raised portion 422 of the conductive film 420 of the conductive particle 400 helps the conductive particle 400 to be electrically connected to the first common pad CP and the second common electrode 220.

Please refer to FIG. 1, FIG. 2, FIG. 3, and FIG. 4. Specifically, in the present embodiment, the border width W1 and a border width W2 (shown in FIG. 1) of the display panel 10 are extremely small, therefore when forming the first alignment film PI1, the first alignment film PH not only covers the multiple pixel electrodes PE located on the active area 110a, but also covers the at least one portion of the first common pad CP located on the peripheral area 110b; when forming the second alignment film PI2, the second alignment film PI2 not only covers a portion of the second common electrode 220 located directly above the active area 110a, but also covers another portion of the second common electrode 220 located directly above the peripheral area 110b. The raised portion 422 of the conductive particle 400 may thrust the first alignment film PH and/or the second alignment film PI2 away; at least one first raised portion 422-1 of the multiple the raised portions 422 of the conductive particle 400 passes through the first alignment film PH and contact the first common pad CP, and/or at least one second raised portion 422-2 of the multiple raised portions 422 of the conductive particle 400 passes through the second alignment film PI2 and contacts the second common electrode 220 located directly above the peripheral area 110b. In this way, even if the border width W1 and the border width W2 are very small and the position of the first common pad CP is very close to the active area 110a and covered by the first alignment film PI1, the conductive particle 400 can still be well electrically connected to the first common pad CP, and then serves as a signal transmit path between the first common pad CP and the second common electrode 220.

Moreover, in the present embodiment, the conductive particle 400 is sandwiched between the first substrate 110 and the second substrate 210, and the core 410 of the conductive particle 400 may be deformed due to pressure. Thereby, a contact area between the conductive film 420 disposed on the surface 410a of the core 410 of the conductive particle 400 and the first common pad CP and/or the second common electrode 220 can be increased, such that the electrical connection between the first common pad CP and the second common electrode 220 can become better.

With reference to FIG. 2, FIG. 3, and FIG. 4, in the present embodiment, the first insulating layer 160 may include a through hole 161 located in the peripheral area 110b, where the at least one conductive particle 400 is located in the through hole 161 of the first insulating layer 160. Specifically, in the present embodiment, the at least one portion of the first conductive pattern 180 of the first common pad CP may be disposed in the corresponding through hole 161 to as to form a concave surface 180s of the first conductive pattern 180 (shown in FIG. 3). A portion of the first alignment film PH may be located on the concave surface 180s of the first conductive pattern 180 of the first common pad CP and in the through hole 161 of the first insulating layer 160. The at least one conductive particle 400 is located on the concave surface 180s of the first conductive pattern 180 and passes through the first alignment film PH so as to contact the first conductive pattern 180 of the first common pad CP.

Please refer to FIG. 3. In the present embodiment, the contact window 151 of the second insulating layer 150 configured to electrically connect the first conductive pattern 180 and the second conductive pattern 140 of the first common pad CP can be disposed under the through hole 161 of the first insulating layer 160, and the through hole 161 of the first insulating layer 160 and the contact window 151 of the second insulating layer 150 may overlap, but the disclosure is not limited thereto.

In the present embodiment, the contact window 131 of the third insulating layer 130 configured to electrically connect the second conductive pattern 140 and the third conductive pattern 120 of the first common pad CP can be disposed under the through hole 161 of the first insulating layer 160, and the through hole 161 of the first insulating layer 160 and the contact window 131 of the third insulating layer 130 may overlap, but the disclosure is not limited thereto.

Please with reference to FIG. 1, FIG. 2 and FIG. 3. In the present embodiment, the multiple through holes 161 of the first insulating layer 160 may include a through hole 161-1. In a top view of the display panel 10, the multiple data lines DL and the through hole 161-1 of the first insulating layer 160 are arranged in the first direction x, the through hole 161-1 of the first insulating layer 160 has a first width L1 in the first direction x, the through hole 161-1 of the first insulating layer 160 has a second width L2 in the second direction y, and the second width L2 is greater than the first width L1. In this way, the first conductive pattern 180 of the first common pad CP disposed in the through hole 161-1 may be designed to have an elongated strip shape, which helps reduce the border width W1 of the display panel 10 in the first direction x.

Moreover, in the present embodiment, the first conductive pattern 180 of the first common pad CP has an elongated strip shape and extends in the second direction y. In this way, the first common pad CP may expand its area without affecting the border width W1 of the display panel 10. The first conductive pattern 180 of the first common pad CP having a large area may electrically contact a sufficient number of the conductive particles 400, such that the first common electrode CL of the pixel structure SPX on the first substrate 110 and the second common electrode 220 on the second substrate 210 can be well electrically connected.

Please with reference to FIG. 1, FIG. 3 and FIG. 4. In the present embodiment, the multiple through holes 161 of the first insulating layer 160 further includes a through hole 161-2. In a top view of the display panel 10, the multiple scan lines SL and the through hole 161-2 of the first insulating layer 160 are arranged in the second direction y, the through hole 161-2 of the first insulating layer 160 has a first width L3 in the first direction x, the through hole 161-2 of the first insulating layer 160 has a second width L4 in the second direction y, and the first width L3 is greater than the second width L4. In this way, the first conductive pattern 180 of the first common pad CP disposed in the through hole 161-2 can correspondingly have an elongated strip shape, which helps to reduce the border width W2 of the display panel 10 in the second direction y.

Moreover, in the present embodiment, the first conductive pattern 180 of the first common pad CP has an elongated strip shape and extends in first second direction x. In this way, the first common pad CP may expand its area without affecting the border width W2 of the display panel 10. The first conductive pattern 180 of the first common pad CP having a large area may electrically contact a sufficient number of the conductive particles 400, such that the first common electrode CL of the pixel structure SPX on the first substrate 110 and the second common electrode 220 on the second substrate 210 can be well electrically connected.

With reference to FIG. 1, FIG. 2, FIG. 3, and FIG. 4, in the present embodiment, the display panel 10 further includes a retaining wall structure 170. The retaining wall structure 170 is disposed between the peripheral area 110b of the first substrate 110 and the second substrate 210. The retaining wall structure 170 defines a predetermined coating range r (shown in FIG. 1). The display panel 10 further includes a sealant 500 disposed on the predetermined coating range r and located between the peripheral area 110b of the first substrate 110 and the second substrate 210. The conductive particle 400 is located in the predetermined coating range r. The retaining wall structure 170 may prevent an extremely thin sealant 500 disposed therein from being punctured by the display medium 300 (for example liquid crystal layer), and/or help the conductive particle 400 to be fixed on the first common pad CP.

In the present embodiment, the retaining wall structure 170 may include an inner retaining wall 171 and an external retaining wall 172, where the inner retaining wall 171 is disposed between the active area 110a of the first substrate 110 and an edge 110e of the first substrate 110 (shown in FIG. 1), the external retaining wall 172 is disposed between the inner retaining wall 171 and the edge 110e of the first substrate 110, the predetermined coating range r is an area between the inner retaining wall 171 and the external retaining wall 172, and the first common pad CP and the predetermined coating range r overlap.

In the present embodiment, at least one of the inner retaining wall 171 and the external retaining wall 172 is a continuous structure. For example, in the present embodiment, both the inner retaining wall 171 and the external retaining wall 172 may be continuous structures. However, the disclosure is not limited thereto. In another embodiment, the inner retaining wall 171 may be a continuous structure, and the external retaining wall 172 may be a discontinuous structure (that is, including multiple microstructures separated from each other); alternately, the inner retaining wall 171 may be a discontinuous structure, and the external retaining wall 172 may be a continuous structure.

Moreover, in the present embodiment, the retaining wall structure 170 may be selectively formed on the first substrate 110 and abuts against the second substrate 210. However, the disclosure is not limited thereto. In other embodiments, the retaining wall structure 170 may also be selectively formed on the second substrate 210 and abuts against the first substrate 110.

It must be noted here that the following embodiment uses the component number and portion content of the aforementioned embodiment, where the same number is configured to represent the same or similar components, and the description of the same technique content is omitted. For the description of omitting the portion, please refer to the aforementioned embodiment, and the following embodiment will not be repeated.

Figure 7:
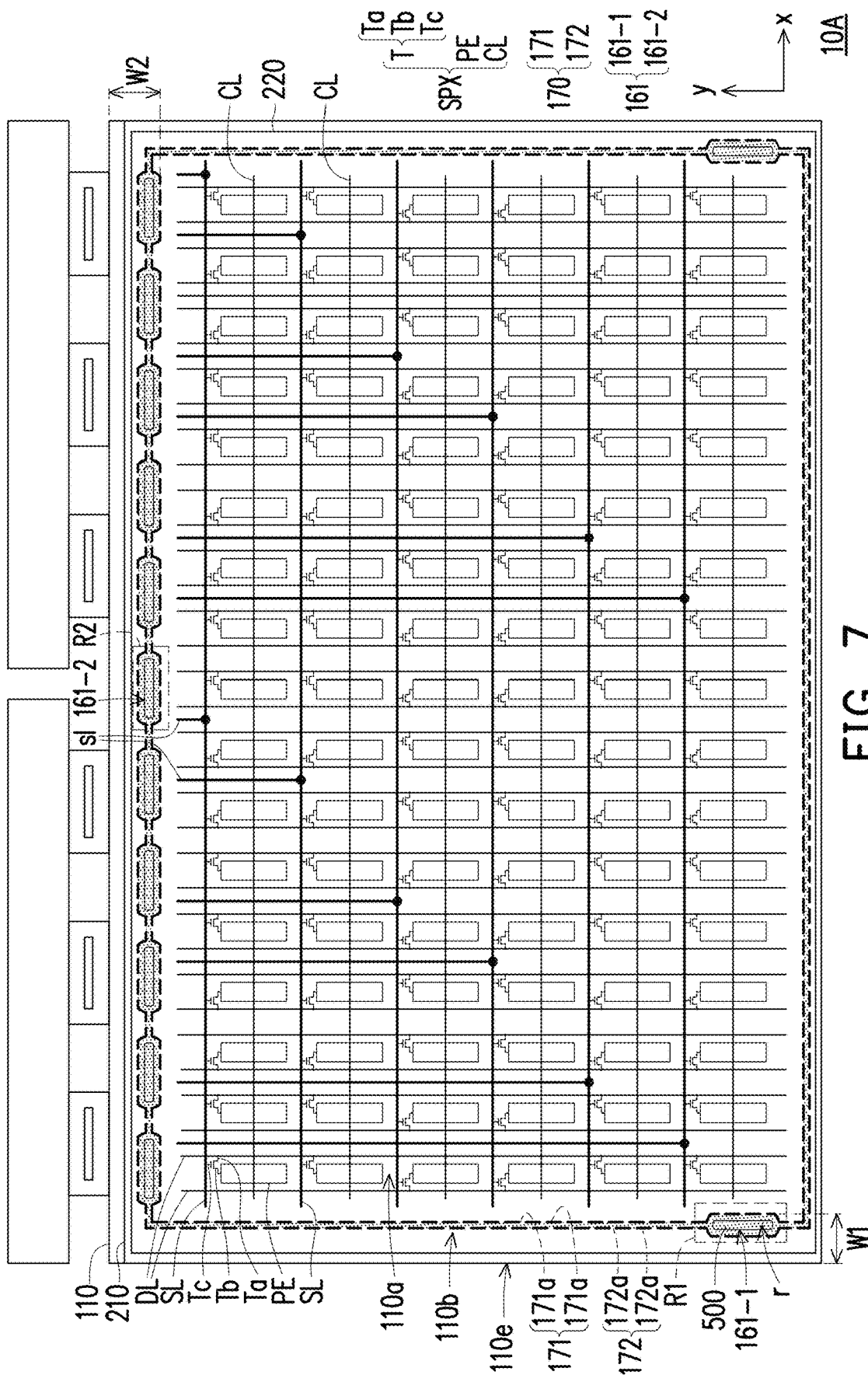
FIG. 7 is a schematic top view of a display panel 10A according to an embodiment of the disclosure.

FIG. 7 is a schematic top view of a display panel 10A according to an embodiment of the disclosure.

The display panel 10A in FIG. 7 is similar to the display panel 10 in FIG. 1. The difference between the two is: the retaining wall structure 170 of the display panel 10 in FIG. 7 is different from the retaining wall structure 170 of the display panel 10 in FIG. 1.

Please refer to FIG. 7. Specifically, in the present embodiment, at least one of the inner retaining wall 171 and the external retaining wall 172 of the retaining wall structure 170 includes multiple microstructures 171a and multiple microstructures 172a separated from with each other. For example, in the present embodiment, the inner retaining wall 171 may include the multiple microstructures 171a separated from each other, and the external retaining wall 172 may include the multiple microstructures 172a separated from each other; that is to say, in the present embodiment, the inner retaining wall 171 and the external retaining wall 172 may both be discontinuous structures, but the disclosure is not limited thereto.

Figure 8:
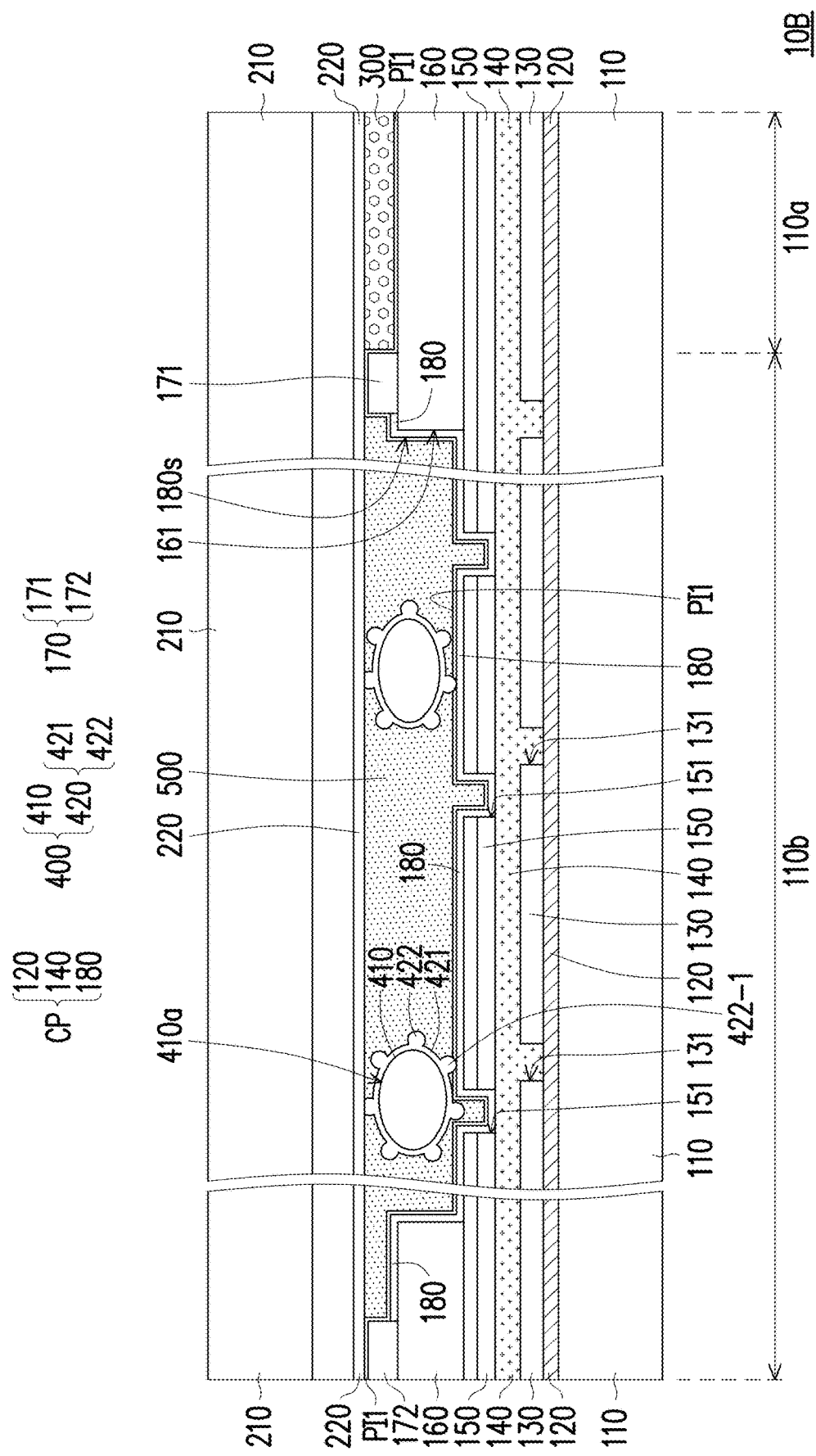
FIG. 8 is a schematic cross-sectional view of a display panel 10B according to an embodiment of the disclosure.

FIG. 8 is a schematic cross-sectional view of a display panel 10B according to an embodiment of the disclosure. The display panel 10B in FIG. 8 is similar to the display panel 10 in FIG. 3. The difference between the two is: the display panel 10B in FIG. 8 may not need to include the second alignment film PI2 of the display panel 10 in FIG. 3. Specifically, in the present embodiment, the second substrate 210 of the display panel 10B in FIG. 8 may not need to be provided with a traditional alignment film that requires transfer coating or printing and spraying. The second substrate 210 of the display panel 10B may be provided with a polymer stabilized alignment layer, which is very small/thin and not shown. In the manufacturing process of the display panel 10B, the display medium 300 includes a liquid crystal composition, a monomer material, and a polymerization initiator, where the polymer stable alignment layer disposed on the second substrate 210 may be formed by polymerizing the monomer material. In the present embodiment, the polymer stabilized alignment layer may be an optically polymerized material or a thermally polymerized material, and the disclosure is not limited thereto.

Figure 9:
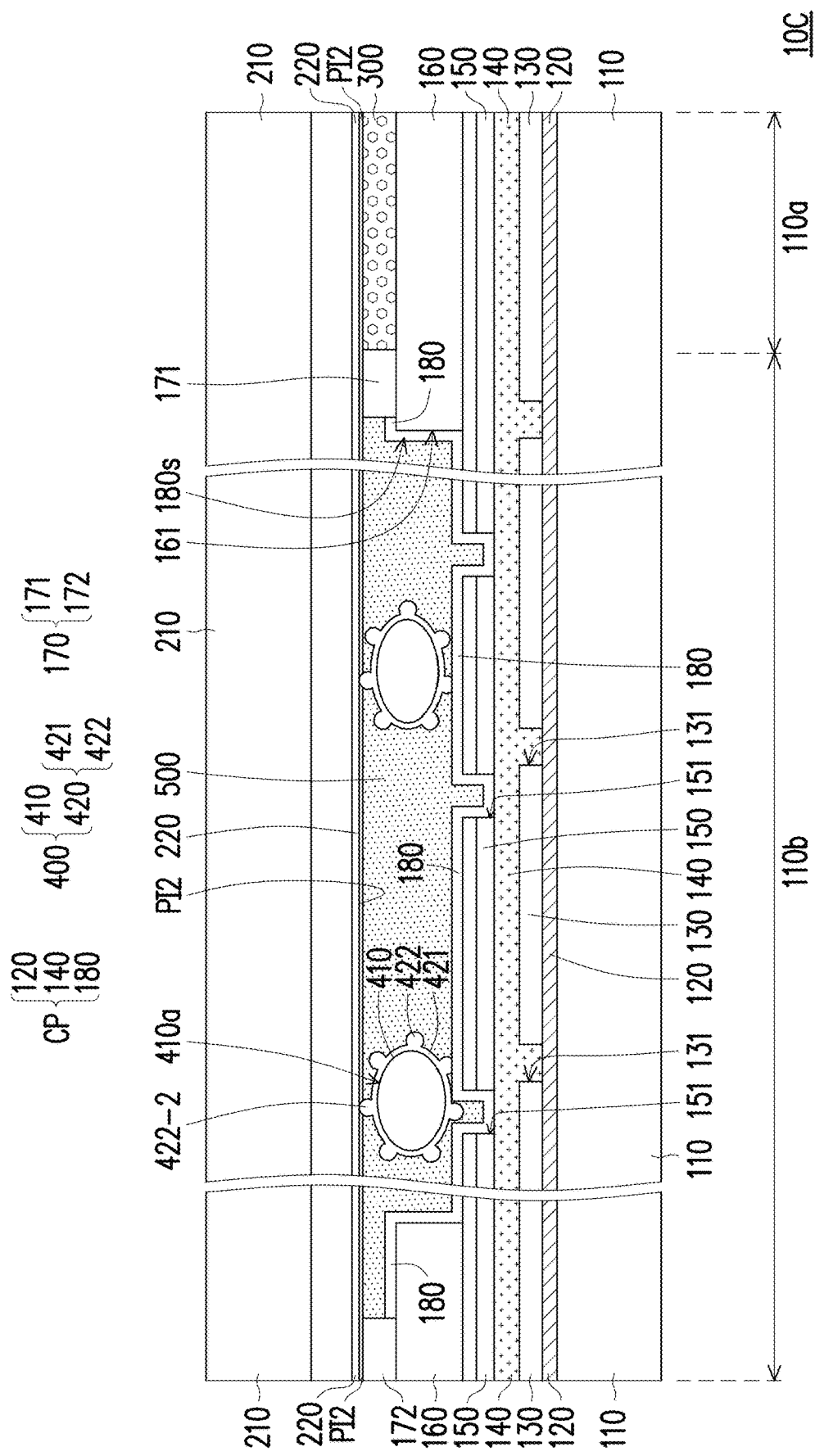
FIG. 9 is a schematic cross-sectional view of a display panel 10C according to an embodiment of the disclosure.

FIG. 9 is a schematic cross-sectional view of a display panel 10C according to an embodiment of the disclosure. The display panel 10C in FIG. 10 is similar to the display panel 10 in FIG. 3. The difference between the two is: the display panel 10C in FIG. 9 may not need to include the first alignment film PI1 of the display panel 10 in FIG. 3. Specifically, in the present embodiment, the first substrate 110 of the display panel 10C in FIG. 10 may not need to be provided with a traditional alignment film that requires transfer coating or printing and spraying. The first substrate 110 of the display panel 10C may be provided with a polymer stabilized alignment layer, which is very small/thin and not shown. In the manufacturing process of the display panel 10C, the display medium 300 includes a liquid crystal composition, a monomer material, and a polymerization initiator, where the polymer stable alignment layer disposed on the first substrate 110 may be formed by polymerizing the monomer material. In the present embodiment, the polymer stabilized alignment layer may be an optically polymerized material or a thermally polymerized material, and the disclosure is not limited thereto.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A display panel, comprising:
   a first substrate, comprising an active area and a peripheral area outside the active area;
   a plurality of pixel structures, disposed on the active area of the first substrate, wherein each of the plurality of pixel structures comprises an active component, a pixel electrode electrically connected to the active component, and a first common electrode;
   a first common pad, disposed on the peripheral area of the first substrate, and electrically connected to the first common electrode of the each of the plurality of pixel structures;
   a second substrate, disposed opposite to the first substrate;
   a second common electrode, disposed on the second substrate;
   a display medium, disposed between the first substrate and the second substrate; at least one conductive particle, disposed on the first common pad, and electrically connected to the first common pad and the second common electrode, wherein the at least one conductive particle comprises:
      a core; and
      a conductive film, disposed on a surface of the core, wherein the conductive film comprises a main portion and a plurality of raised portions, and a film thickness of each of the plurality of raised portions is greater than a film thickness of the main portion;
   a first alignment film, disposed on the first substrate and covering at least one portion of the first common pad, wherein at least one of the plurality of raised portions of the at least one conductive particle passes through the first alignment film and contacts the first common pad; and
   a second alignment film, disposed on the second substrate and covering the second common electrode, wherein at least one of the plurality of raised portions of the at least one conductive particle passes through the second alignment film and contacts the second common electrode.

2. The display panel as described in claim 1, wherein the first common pad comprises a first conductive pattern, and the display panel further comprises:
   a first insulating layer, wherein at least one portion of the first conductive pattern is disposed in a through hole of the first insulating layer, and a portion of the first alignment film is located on the first conductive pattern and in the through hole of the first insulating layer.

3. The display panel as described in claim 2, wherein the at least one conductive particle is located in the through hole of the first insulating layer.

4. The display panel as described in claim 1, further comprising:
   a plurality of data lines, disposed on the first substrate, and electrically connected to a plurality of active components of the plurality of pixel structures, wherein the plurality of data lines are arranged in a first direction;
   a plurality of scan lines, disposed on the first substrate, and electrically connected to the plurality of active components of the plurality of pixel structures, wherein the plurality of scan lines are arranged in a second direction, and the first direction and the second direction are staggered; and
   a plurality of transfer lines, disposed on the first substrate, wherein the plurality of transfer lines are electrically connected to the plurality of scan lines and are arranged in the first direction.

5. The display panel as described in claim 4, wherein the first common pad comprises a first conductive pattern, and the display panel further comprises:
   a first insulating layer, wherein at least one portion of the first conductive pattern is disposed in a through hole of the first insulating layer;
   wherein in a top view of the display panel, the plurality of data lines and the through hole of the first insulating layer are arranged in the first direction, the through hole of the first insulating layer has a first width in the first direction, the through hole of the first insulating layer has a second width in the second direction, and the second width is greater than the first width.

6. The display panel as described in claim 4, wherein the first common pad comprises a first conductive pattern, and the display panel further comprises:
   a first insulating layer, wherein at least one portion of the first conductive pattern is disposed in a through hole of the first insulating layer;
   wherein in a top view of the display panel, the plurality of scan lines and the through hole of the first insulating layer are arranged in the second direction, the through hole of the first insulating layer has a first width in the first direction, the through hole of the first insulating layer has a second width in the second direction, and the first width is greater than the second width.

7. The display panel as described in claim 1, wherein the display panel further comprises a second insulating layer disposed on the first substrate, and the first common pad comprises:
   a first conductive pattern, wherein the second insulating layer is disposed between the first conductive pattern and the first substrate; and
   a second conductive pattern, disposed between the second insulating layer and the first substrate, wherein the first conductive pattern is electrically connected to the second conductive pattern through at least one contact window of the second insulating layer.

8. The display panel as described in claim 7, wherein the first conductive pattern is connected in parallel with the second conductive pattern.

9. The display panel as described in claim 1, further comprising:
   a retaining wall structure, disposed between the peripheral area of the first substrate and the second substrate, wherein the retaining wall structure defines a predetermined coating range; and
   a sealant, disposed on the predetermined coating range and located between the peripheral area of the first substrate and the second substrate, wherein the at least one conductive particle is located in the predetermined coating range.

10. The display panel as described in claim 9, wherein the retaining wall structure comprises:
    an inner retaining wall, disposed between the active area of the first substrate and an edge of the first substrate; and
    an external retaining wall, disposed between the inner retaining wall and the edge of the first substrate, wherein the predetermined coating range is an area between the inner retaining wall and the external retaining wall, and the first common pad and the predetermined coating range overlap.

11. The display panel as described in claim 10, wherein at least one of the inner retaining wall and the external retaining wall is a continuous structure; alternately, the at least one of the inner retaining wall and the external retaining wall comprises a plurality of microstructures separated from each other.

\* \* \* \* \*